United States Patent [19]
Hoshino et al.

[11] Patent Number: 6,143,473
[45] Date of Patent: Nov. 7, 2000

[54] FILM PATTERNING METHOD UTILIZING POST-DEVELOPMENT RESIDUE REMOVER

[75] Inventors: Eiichi Hoshino; Masahiko Uraguchi; Toshikatsu Minagawa; Yuuichi Yamamoto; Yukihiro Sato, all of Kanagawa, Japan

[73] Assignee: Fujitsu Limited, Kawasaki, Japan

[21] Appl. No.: 09/258,130

[22] Filed: Feb. 26, 1999

[30] Foreign Application Priority Data

May 20, 1998 [JP] Japan .................................. 10-138677

[51] Int. Cl.⁷ ....................................................... G03C 5/00
[52] U.S. Cl. .......................... 430/296; 430/313; 430/318; 430/328; 430/331
[58] Field of Search ..................................... 430/296, 313, 430/318, 328, 331

[56] References Cited

FOREIGN PATENT DOCUMENTS

| | | |
|---|---|---|
| 56-1536 | 1/1981 | Japan . |
| 57-12522 | 1/1982 | Japan . |
| 57-66633 | 4/1982 | Japan . |
| 57-115832 | 7/1982 | Japan . |
| 57-179839 | 11/1982 | Japan . |
| 58-218126 | 12/1983 | Japan . |
| 61-77852 | 4/1986 | Japan . |
| 61-108135 | 5/1986 | Japan . |
| 3-154330 | 7/1991 | Japan . |
| 4-302427 | 10/1992 | Japan . |

*Primary Examiner*—Christopher G. Young
*Attorney, Agent, or Firm*—Armstrong, Westerman, Hattori, McLeland & Naughton

[57] ABSTRACT

A film patterning method using resist as a mask, comprises the steps of forming a film 2 on a substrate 1, coating resist 3 on the film 2, exposing the resist 3, developing the resist 3 by a liquid phase developing solution 4, removing the liquid developing solution 4 from a surface of the film 2, irradiating ultraviolet rays onto the resist 3, which remains on the film 2 by the developing step, in an oxygen containing atmosphere, removing developed residue of the surface of the resist 3 by supplying an alkali aqueous solution 5 to the resist 3 which has remained on the film 2, and forming patterns of the film 2 by etching the film 2 exposed from the resist 3. Accordingly, the unnecessary residue of resist can be removed from the substrate in a short time after the development.

6 Claims, 13 Drawing Sheets

Developing Process → UV Irradiation → Alkali Aqueous Solution
UV Irradiation Time : 0 second x 15000

Developing Process → UV Irradiation → Alkali Aqueous Solution
UV Irradiation Time : 120 seconds x 15000 x 15000 x 15000

Developing Process → UV Irradiation → Alkali Aqueous Solution
UV Irradiation Time : 180 seconds x 15000

Developing Process → UV Irradiation → Alkali Aqueous Solution
UV Irradiation Time : 240 seconds x 15000 x 15000 x 15000

UV Irradiation Time : 0 second x 40000

UV Irradiation Time : 120 seconds x 40000

X 40000 x 40000

UV Irradiation Time : 180 seconds x 40000

UV Irradiation Time : 240 seconds x 40000 x 40000 x 40000

FILM PATTERNING METHOD UTILIZING POST-DEVELOPMENT RESIDUE REMOVER

BACKGROUND OF THE INVENTION

1. Field of the Invention

The present invention relates to a film forming method and, more particularly, a method of patterning a film by using resist patterns, which are formed via exposure and development, as a mask after the resist has been coated on the film.

2. Description of the Prior Art

The step of patterning a film by using the photolithography technology is included in manufacturing the semiconductor device. In the photolithography technology, resist patterns which are formed by exposing and developing resist being coated on the film are employed as a mask. In exposure of the resist, a latent image is formed by transferring light shielding patterns formed on a reticle onto the resist.

Normally the light shielding patterns of the reticle are formed of chromium or chromium oxide, and they are formed via following steps by using the photolithography technology.

First, as shown in FIG. 1A, a light shielding film 102 formed of chromium or chromium oxide is formed of a quartz substrate 101, and then a radiation-induced polymerization type resist 103 is coated on the light shielding film 102 as photosensitive material and then prebaked.

Then, as shown in FIG. 1B, the latent image is depicted on the resist 103 by electron beams, for example. Then, as shown in FIG. 1C, patterns are formed by developing the latent image on the resist 103 by the developing process.

Then, as shown in FIG. 1D, the patterns of the resist 103 are transferred onto the light shielding film 102 by etching portions of the light shielding film 102 being exposed from the patterns of the resist 103.

Finally, as shown in FIG. 1E, the resist 103 is removed from the quartz substrate 101 by exposing the resist 103 to oxygen plasma or immersing the resist 103 in a mixed solution of sulfuric acid and hydrogen peroxide solution.

With the above, formation of the reticle has been terminated. In this case, if material having a gelling action, e.g., polystyrene is employed as the resist 103, developed residues are easily caused. The developed residue corresponds to such a phenomenon that the resist remains on unnecessary locations because of incomplete development of the resist.

If such developed residues are caused, there have been problems described in the following. First, linearity of edges of the patterns of the light shielding film 102 is deteriorated. Second, side portions of the patterns of the light shielding film 102 are formed like a taper to thus reduce the pattern precision. Third, the film below the resist 103 is etched incompletely because the resist 103 remains thin like islands on regions from which the resist 103 is to be essentially removed. Such unnecessary island-like resists are called "developed residues of resist" hereinafter.

These problems are now being overcome by the process which is called the "descum" step.

The descum step is defined as a step of removing the developed residue of resist by etching slightly the resist by using the oxygen plasma after exposure and development of the resist have been finished, or a step of removing the developed residue of resist by means of oxidation irradiated by the ultraviolet rays (UV) onto the resist in the oxygen containing atmosphere after exposure and development of the resist have been completed.

To irradiate the ultraviolet rays onto the developed residue of resist in such oxygen containing atmosphere is set forth in Patent Application Publication (KOKAI) Sho 58-218126. The ultraviolet ray irradiation is carried out in the vacuum evaporation equipment.

To employ the deep ultraviolet rays (DUV) in place of the ultraviolet rays is set forth in Patent Application Publication (KOKAI) Sho 61-77852, Patent Application Publication (KOKAI) Hei 4-302427, Patent Application Publication (KOKAI) Hei 3-154330, Patent Application Publication (KOKAI) Sho 61-108135, and Patent Application Publication (KOKAI) Sho 57-66633.

As the oxygen containing gas, the air is employed in Patent Application Publication (KOKAI) Sho 61-77852, the ozone is employed in Patent Application Publication (KOKAI) Hei 4-302427, and the oxygen is employed in Patent Application Publication (KOKAI) Sho 57-66633, Patent Application Publication (KOKAI) Sho 61-108135, and Patent Application Publication (KOKAI) Hei 3-154330.

However, it needs a large-scaled and high-priced plasma generating equipment to employ the oxygen plasma as the descum step.

Also, it does not need particularly the large-scaled equipment to employ the ultraviolet ray irradiation and the oxygen atmosphere as the descum step. Nevertheless, such descum step cannot remove the unnecessary resist in a short time, so that throughput cannot be improved.

In addition, if such descum process is continued until the unnecessary resist has completely been removed, the shape of the resist patterns acting as a mask is damaged.

SUMMARY OF THE INVENTION

It is an object of the present invention to provide a film patterning method including steps which is able to remove unnecessary residue of resist from a surface of a substrate in a short time without damage of shapes of resist patterns.

The above problems can be overcome by providing a film patterning method which comprises the steps of forming a film on a substrate; coating resist on the film; exposing the resist; developing the resist by a liquid developing solution; removing the liquid developing solution from a surface of the film; irradiating ultraviolet rays onto the resist, which remains on the film by the developing step, in an oxygen containing atmosphere; removing developed residue of the resist by supplying an alkali aqueous solution to the resist which has remained on the film; and forming patterns of the film by etching the film exposed from the resist.

According to the present invention, the resist coated on the film is exposed and developed, then the ultraviolet rays are irradiated onto the developed residues of the resist, and then the developed residues of the resist is removed by the alkali aqueous solution.

Although a very small amount of developed residues of the resist has been gelled by mean of the irradiation of the ultraviolet rays, functional groups of the resist can be destroyed by irradiation of the ultraviolet rays, so that adhesiveness between the developed residues of the resist and the underlying film can be considerably reduced. In addition, oxygen in the oxygen containing atmosphere such as the outer air is changed into ozone by the irradiation of the ultraviolet rays to thus oxidize the developed residues of the resist. Such irradiation of the ultraviolet rays is set to a degree that the developed residues of the resist is removed completely but molecules of the developed residues of the resist is decreased. As a result, damage of the resist patterns, which are needed essentially, is not substantially caused by the irradiation of the ultraviolet rays.

The developed residues of the resist, whose molecules have been reduced, are bonded with constitutive molecules of the alkali aqueous solution and then removed from the film. Thus, the developed residues of the resist can be washed away.

Tapered resist formed on the side portion of the resist patterns are oxidized simultaneously with removal of the developed residues of the resist, and are contracted by the alkali aqueous solution.

According to the above process of removing the developed residues of the resist, a very small amount of unnecessary resist on the film can be removed selectively without a large-scaled equipment particularly and in addition the pattern precision of the resist patterns is in no means deteriorated.

DESCRIPTION OF THE PREFERRED EMBODIMENTS

Embodiments of the present invention will be explained in detail with reference to the accompanying drawings hereinafter.

FIGS. 2A to 2H are sectional views showing film patterning steps according to an embodiment of the present invention.

Figure 1A:
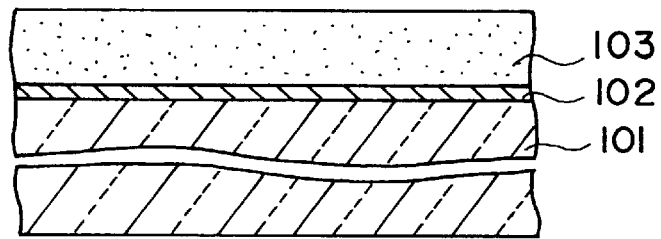
FIGS. 1A to 1E are sectional views showing film patterning steps in the prior art.
Figure 1B:
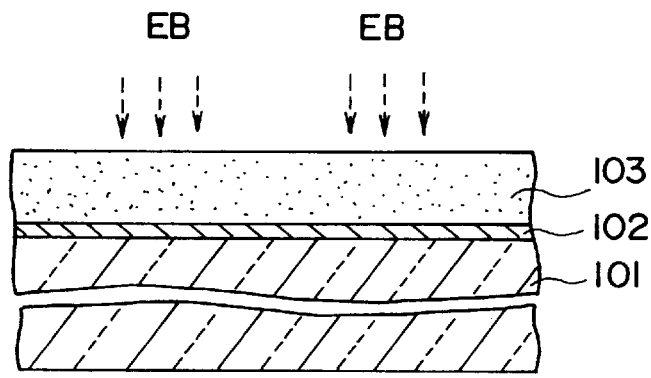
Figure 1C:
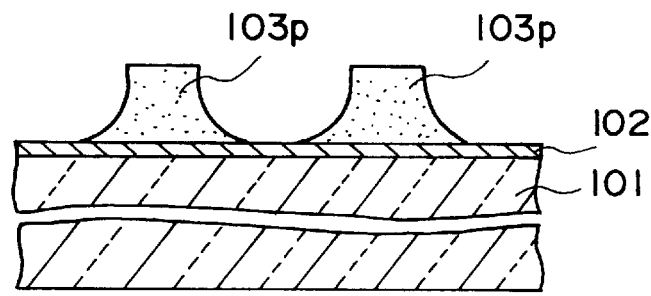
Figure 1D:
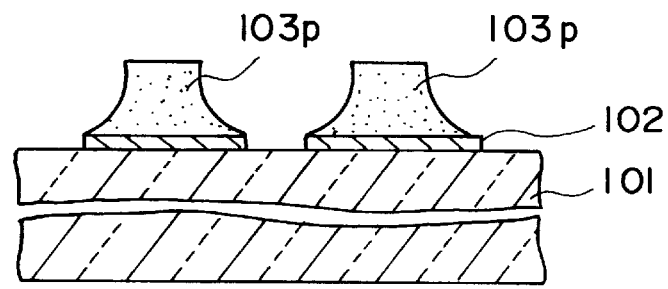
Figure 1E:
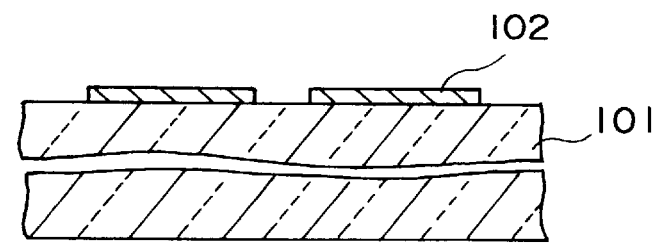

To begin with, steps required until the configuration shown in FIG. 1A is implemented will be explained.

Figure 2A:
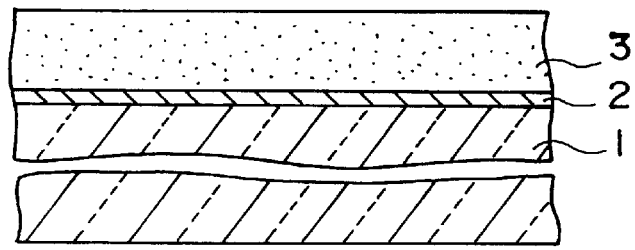
FIGS. 2A to 2H are sectional views showing film patterning steps according to an embodiment of the present invention.

In FIG. 2A, a light shielding film 2 made of chromium (Cr) or chromium oxide (CrO) is formed on a quartz or silica glass substrate (transparent substrate) 1 by sputter to have a thickness of 60 to 100 nm. Then, negative-type resist 3 of 300 nm thickness, for example, is coated on the light shielding film 2 by the spin coating method.

As the negative-type resist 3, for example, there is material in which TNP (tris(nonylphenyl)posphite) and BHT (2,6-di-t-butyl-4-methylphenol) as radical trap agents are added to chloromethylated styrene as a main component or material made of copolymer of chloromethylation styrene and chlorostyrene. As a particular example, of the resist 3 containing such material, there is the Resist "ZEN4100" (trade name) manufactured by Nippon Zeon Co., Ltd. of Tokyo, Japan. The "ZEN-4100" is a resist based on a propylene-glycol-mono-methyl-ether-acetate $CH_3OCH_2CH(OCOCH_3)CH_3$ solvent and a polystyrene resin derivative. A concentration of the solvent is from 80 to 95 wt %. A chemical structure of the resin is as follows:

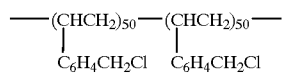

Then, the quartz glass substrate 1 is placed on a hot plate (not shown) and then the resist 3 is prebaked at a temperature of 120° C. for 15 minutes. The substrate 1, the light shielding film 2, and the resist 3, all being subjected to such prebaking, are called a photoplate substrate.

Figure 2B:
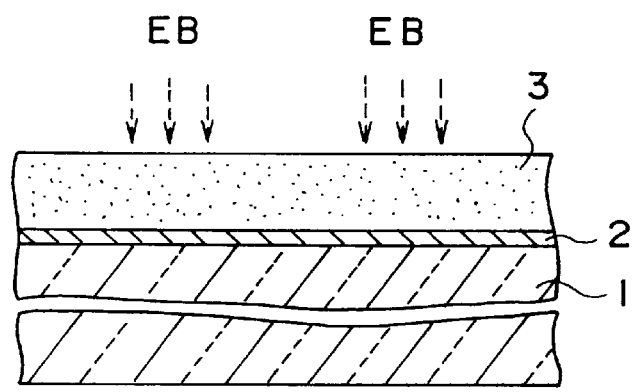

Then, as shown in FIG. 2B, a latent image is formed on the resist 3 by exposure. The exposure is effected by the direct drawing method which penetrates electron beams (EB) into the resist 3 by using the vector scan type electron beam exposure machine, for example. As irradiation conditions for the electron beams, an accelerating voltage is set to 20 keV, and an electron irradiation dose is set to 1.0 to 19 $\mu C/cm^2$, for example.

In turn, the quartz glass substrate 1 is placed on a rotating table (not shown) of the developing apparatus. Then, a liquid phase developing solution 4 is supplied to the resist 3 while rotating the rotating table at a low speed such as 250 rpm, and then the rotation of the rotating table is stopped to cause the state that the liquid phase developing solution 4 stands up above the resist 3. Under this state, the resist 3 is developed. Such developing method is normally called the paddle development.

Figure 2C:
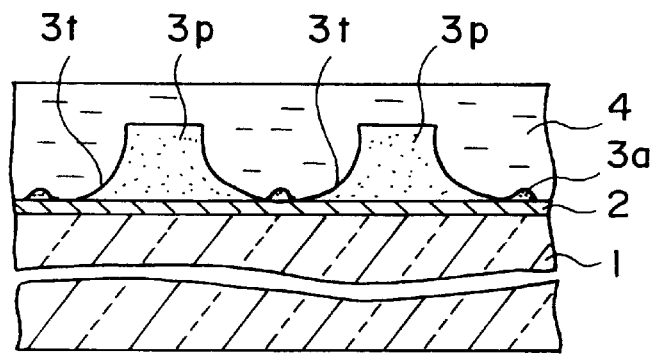

As the developing solution, for example, a mixed solution of isoamyl acetate and ethylcellosolve is employed. Such development is executed for about 180 second to thus change the latent image formed on the resist 3 into the visual image, as shown in FIG. 2C. As a result, portions of the resist 3 being not irradiated by the electron beams are removed substantially, so that resist patterns 3p are formed.

Subsequently, surfaces of the resist 3 and the light shielding film 2 are cleaned by supplying the ethylcellosolve as a rinsing liquid to the resist 3 and the light shielding film 2 for 15 second. After supply of the rinse solution has been stopped, the revolution number of the rotating table (not shown) is set to 2000 rpm so as to dry the surfaces of the resist 3 and the light shielding film 2.

As shown in FIG. 2C, immediately after the development of the resist, island-like thin developed residues 3a of the resist 3 remain on regions to which the electron beams are not irradiated and also taper portions 3t as developed residues of the resist 3 are formed on side portions of the resist patterns 3p.

Therefore, the descum process described in the following is executed to remove such developed residues 3a of the resist 3.

Figure 2D:
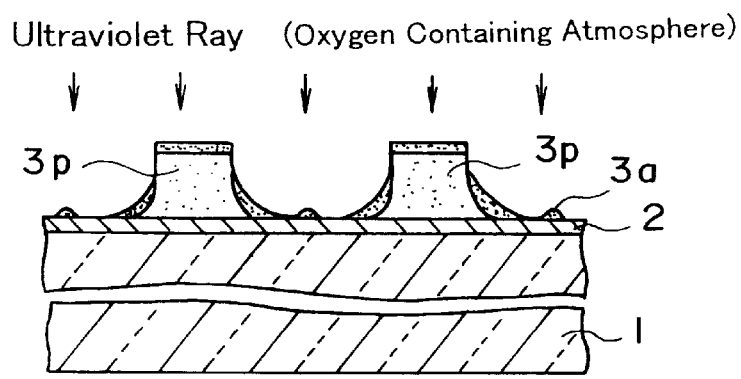

At first, as shown in FIG. 2D, under the condition that the quartz glass substrate 1 is placed in the oxygen containing atmosphere, e.g., the atmosphere, the air, the oxygen gas, the ozone gas, etc., the ultraviolet rays are irradiated onto the resist 3 remaining on the light shielding film 2. Such ultraviolet ray irradiation is carried out by using a low pressure mercury lamp having an energy density of 2 $mW/cm^2$. An irradiation time is set to such extent that the developed residues 3a of the resist 3 still remain after the ultraviolet ray irradiation.

Figure 2E:
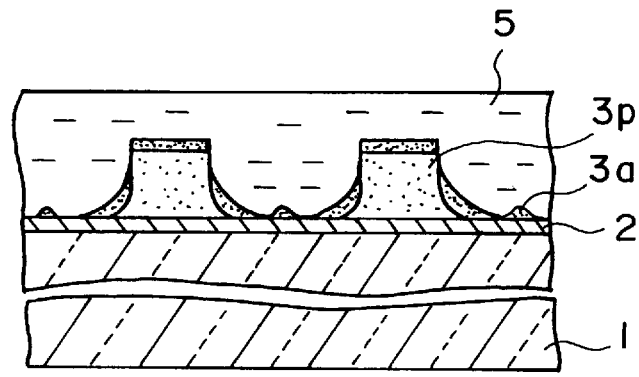
Figure 2F:
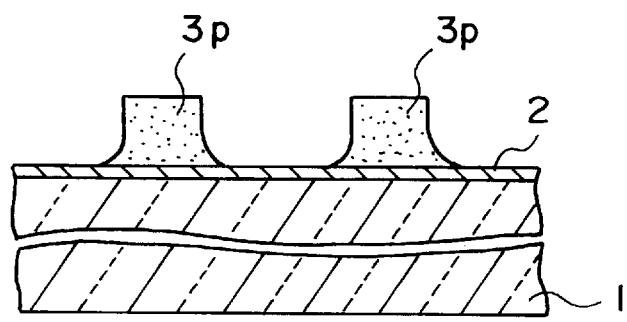

After this, the quartz glass substrate 1 is loaded on the rotating table (not shown). Then, as shown in FIG. 2E, the alkali aqueous solution 5, e.g., the alkali aqueous solution "ZTMA-100" (trade name) manufactured by Nippon Zeon Co., Ltd. is sprayed toward the resist 3 and the light shielding film 2 by the spray method for 60 second, for example. The "ZTMA-100" is a developer based on an aqueous solution in which a concentration of tetramethylammonium hydroxide $(CH_3)_4NOH$ is 2.38%. As a result, as shown in FIG. 2F, the developed residues 3a of the resist 3 has been removed by the alkali aqueous solution 5 and in addition the taper portions 3t formed on the side portions of the resist patterns 3p has shrunken.

Like the above, the reasons why the developed residues 3a of the resist 3 has been eliminated without deformation of the profiles of the resist patterns 3p and also the taper portions 3t formed on the side portions of the resist patterns 3p has shrunken will be given as follows.

In other words, in the resist which is not exposed or is exposed insufficiently after development, radicals generated in the air by irradiation of the ultraviolet rays are absorbed by a radical trap agent and gelation of the resist is accelerated. Then, oxidation reaction of the thin gelled resist resin is generated by ozone in the atmosphere or air, which is generated when the atmosphere or air is exposed to the ultraviolet rays. In this case, in thin areas of the taper portion 3t formed on the side portion of the resist pattern 3p, oxidation proceeds to the boundary between the substrate and the taper portion 3t in depth. Although oxidation of the developed residues 3a of the resist 3 is incomplete, adhesiveness between the developed residues 3a of the resist 3 and the light shielding film 2 is degraded since functional groups at the bottom of the developed residues 3a of the resist 3 are destroyed by the irradiation of the ultraviolet rays.

Because of such destruction of the functional groups and the oxidation, such developed residues 3a of the resist 3 is brought into its easily peeled state. In addition, the developed residues 3a of the resist 3 are bonded to constitutive elements of the alkali aqueous solution 5 to thus be removed from the light shielding film 2.

According to the irradiation of the ultraviolet rays in the atmosphere, a deep area of the resist patterns 3p from its surface is not oxidized although the surface of the resist patterns 3p is slightly oxidized. In addition, it is not the condition for a dose and an irradiation time of the ultraviolet rays which are requested until the functional groups at the bottom of the resist patterns 3p are destroyed.

Also, even though the taper portions 3t formed on the side portions of the resist patterns 3p cannot be completely removed by the alkali aqueous solution 5, a remaining amount of the taper portions 3t may be within an allowable limit.

After the patterning of the resist, the irradiation of the ultraviolet rays, and the spraying of the alkali aqueous solution have been finished, the resist patterns 3p and the light shielding film 6 are rinsed for 60 second on a rotating table (not shown), and then the moisture is released from the quartz glass substrate 1 by spinning the rotating table at a rate of 2000 rpm to dry the quartz glass substrate 1. Postbake is effected before or after the irradiation of the ultraviolet rays.

Figure 2G:
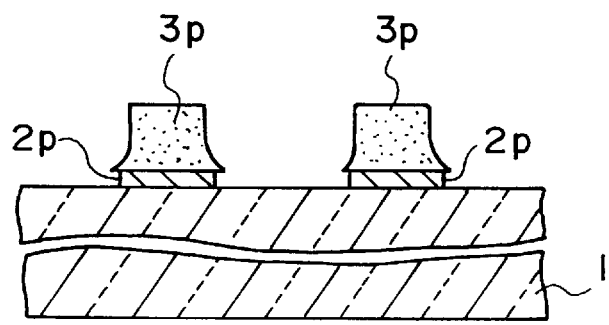

As shown in FIG. 2G, the light shielding film 2 exposed from the resist patterns 3p is etched using the resist patterns 3p as a mask and removed, so that the light shielding film 2 is patterned. As etching of the light shielding film 2 made of chromium or chromium oxide, either the wet etching method or the dry etching method may be employed.

As an etchant employed in the wet etching method, for example, there is a mixed solution of ammonium ceric nitrate and perchloric acid solution. In the case that the technique such as reactive ion etching, plasma etching, etc. is applied as the dry etching method, a reaction gas including any of trichloromethane, carbon tetrachloride, chlorine, methylene chloride, etc., for example, is employed as the etching gas.

Figure 2H:
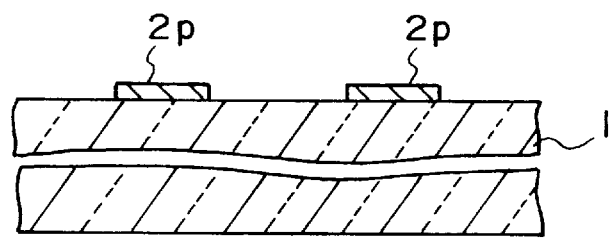

After such light shielding film 2 has been patterned, the resist patterns 3p are removed by the dry ashing using the oxygen plasma. Thus, as shown in FIG. 2H, light shielding patterns 2p appear on the quartz glass substrate 1.

With the above steps, steps of manufacturing the reticle have been completed.

Next, type of the alkali aqueous solution will be explained hereinbelow.

In the above example, the alkali aqueous solution "ZTMA-100" (trade name) manufactured by Nippon Zeon Co., Ltd. is employed as the alkali aqueous solution. The alkali aqueous solution "ZTMA-100" is a solution containing tetramethylammonium hydroxide (TMAH) which is diluted with the pure water to the concentration of 2.38 wt %. In addition, the alkali aqueous solution "NMD-3" (trade name) manufactured by Tokyo Ohka Kogyo Co., Ltd. of Kawasaki City, Kanagawa Prefecture, Japan, may be employed as the alkali aqueous solution. The "NDM-3" is the same as the "ZTMA-100". Instead of the above solution, 1 wt % KOH (potassium hydroxide) as the weak alkali aqueous solution or 1 wt % NaOH (sodium hydroxide) may be employed as the alkali aqueous solution.

The optimal concentration of the alkali aqueous solution 5 is associated with a process time. In the event that a time required for exposing the resist 3 ( 3p , 3t) to the alkali aqueous solution 5 is in excess of 60 second, it is possible to ignore either a time required until a flow rate is stabilized after the alkali aqueous solution 5 starts to eject from a spray or a time required from when supply of the chemicals is stopped until discharge of the chemicals stored in a spray pipe can be completely finished.

The higher the alkali concentration of the alkali aqueous solution 5 the shorter the process time. Therefore, it is preferable that pH of the alkali concentration exceeds 10.

Next, material of the resist will be explained hereinbelow.

Although the the Resist "ZEN4100" (trade name) is employed as resist material in the above example, such resist material is not limited to the above. For instance, there is the Resist "SAL-601" (trade name) which is manufactured by the Syprey Co. of Tokyo, Japan, and is the negative resist including Novolak resin as a main component. The solvent of the resist "SAL-601" is the same as the solvent of the "ZEN-4100", and a concentration of the solvent is 90% and more. The resin of the "SAL-601" is a cresylic novolak resin having a chemical structure as follows:

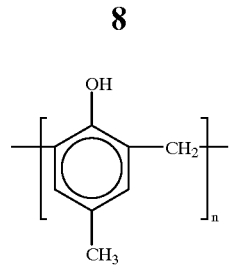

Further, an acid-generator agent is contained in the SAL-601 as another component. The ultraviolet rays are irradiated onto this resist material, like the "ZEN4100", after it is subjected to coating, exposure, and development, and then the above alkali aqueous solution 5 is supplied to the resist material.

In addition to the above, negative resist material which contains PVP (polyvinylphenol) resin as a main component can be employed as such resist.

Experimental results of the patterning of the resist 3 according to the above embodiments will be explained hereunder.

To begin with, when it has been examined how removal of the developed residues 3a of the resist 3 is changed according to the irradiation time of the ultraviolet ray within a series of steps of performing irradiation of the ultraviolet rays and supply of the alkali aqueous solution after the above development, results can be given by perspective sectional views shown in FIGS. 3A, 4A, 5A and 6A. These views shown in FIGS. 3A, 4A, 5A and 6A are depicted based on SEM photographs as shown in FIGS. 3B, 4B, 5B and 6B respectively, and the line & space resist patterns 3p having a width of 2.0 μm are magnified to about 15000 times.

Figure 3A:
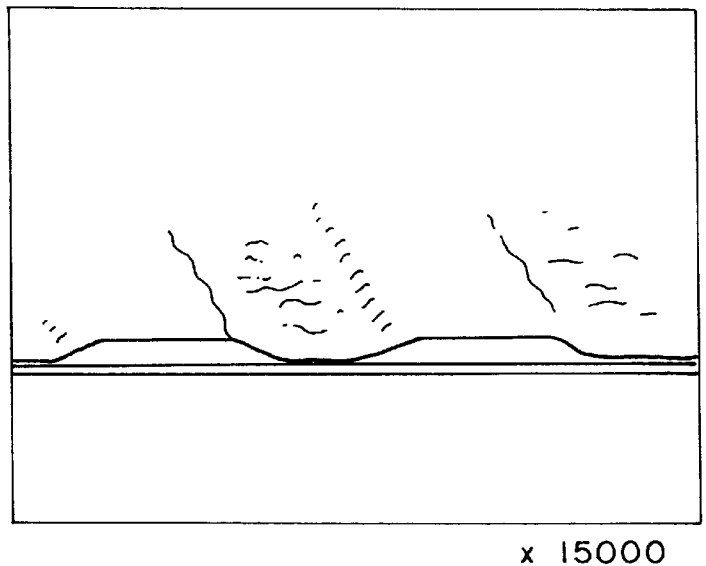
FIG. 3 is an enlarged perspective sectional view showing the state of resist, which is employed for the film patterning steps according to the embodiment of the present invention, immediately after the resist has been developed.

FIG. 3A shows the state of the substrate and layers formed on the substrate immediately after the resist has been developed. It has been found from FIG. 3A that a plenty of developed residues of the resist still remain in regions between resist patterns.

Figure 4A:
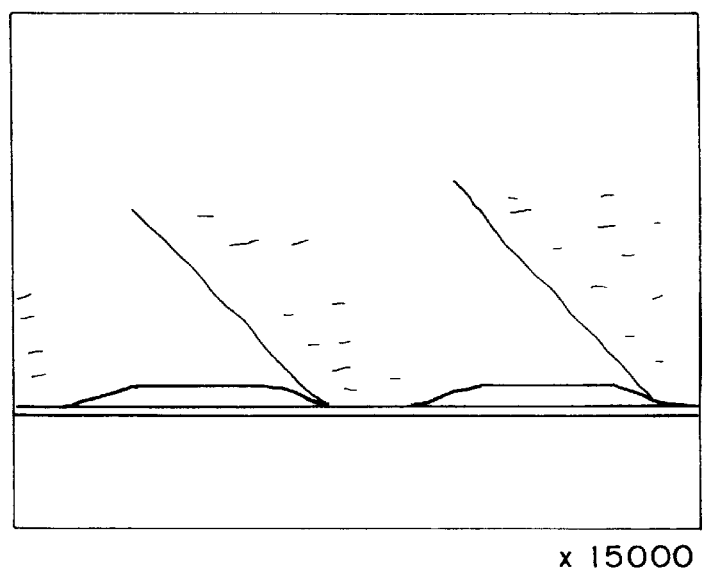
FIG. 4A is an enlarged perspective sectional view showing the state of resist, which is employed for the film patterning steps according to the embodiment of the present invention, after ultraviolet rays have been irradiated onto the resist for 120 second after the development and then an alkali aqueous solution has been supplied to the surface of the resist.
Figure 3B:
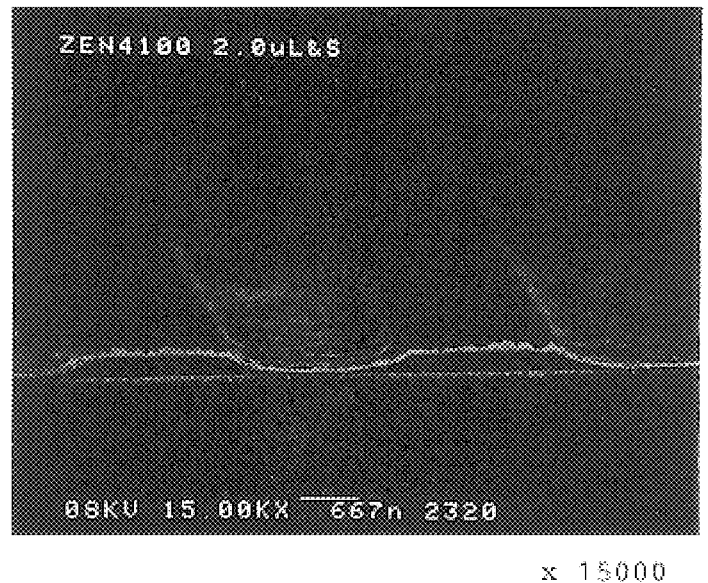
Figure 4B:
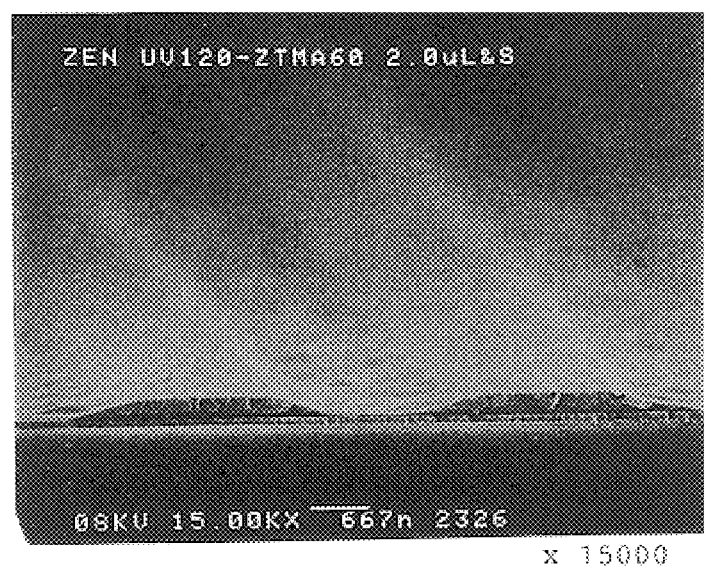
FIG. 4B is an enlarged perspective sectional picture showing the state of resist, which is employed for the film patterning steps according to the embodiment of the present invention, after ultraviolet rays have been irradiated onto the resist for 120 second after the development and then an alkali aqueous solution has been supplied to the surface of the resist.

FIG. 4A shows the state of the substrate and layers formed on the substrate after ultraviolet rays have been irradiated onto the resist for 120 second after the development and then the alkali aqueous solution has been supplied to the resist.

Figure 5A:
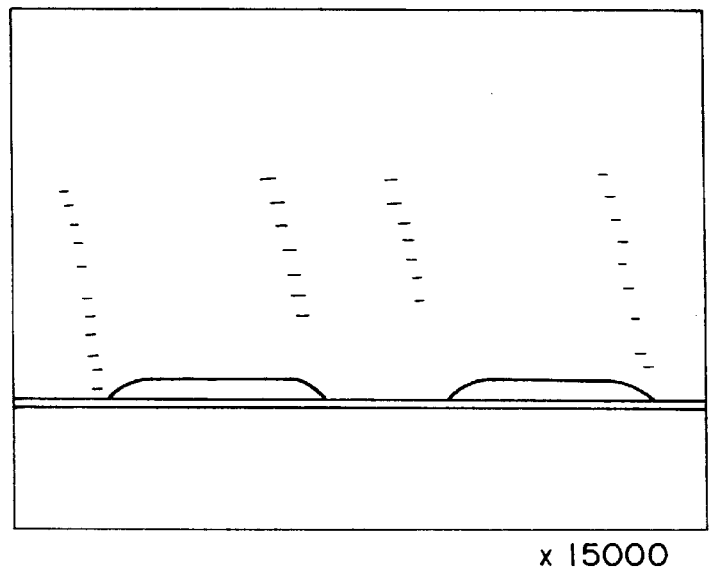
FIG. 5A is an enlarged perspective sectional view showing the state of resist, which is employed for the film patterning steps according to the embodiment of the present invention, after ultraviolet rays have been irradiated onto the resist for 180 second after the development and then an alkali aqueous solution has been supplied to the surface of the resist.

FIG. 5A shows the state of the substrate and layers formed on the substrate after ultraviolet rays have been irradiated onto the resist for 180 second after the development and then the alkali aqueous solution has been supplied to the resist.

Figure 6A:
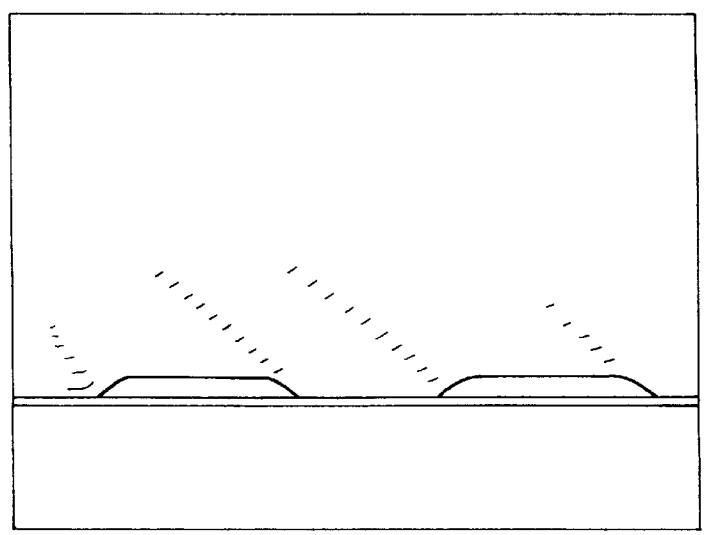
FIG. 6A is an enlarged perspective sectional view showing the state of resist, which is employed for the film patterning steps according to the embodiment of the present invention, after ultraviolet rays have been irradiated onto the resist for 240 second after the development and then an alkali aqueous solution has been supplied to the surface of the resist.
Figure 5B:
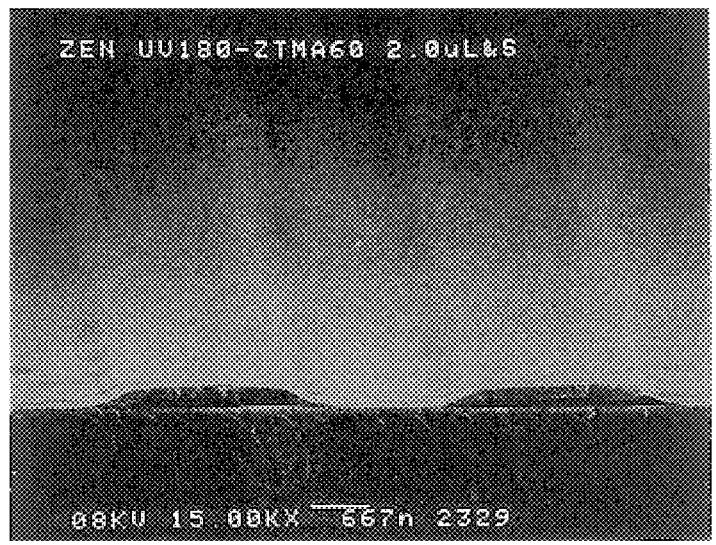
FIG. 5B is an enlarged perspective sectional picture showing the state of resist, which is employed for the film patterning steps according to the embodiment of the present invention, after ultraviolet rays have been irradiated onto the resist for 180 second after the development and then an alkali aqueous solution has been supplied to the surface of the resist.
Figure 6B:
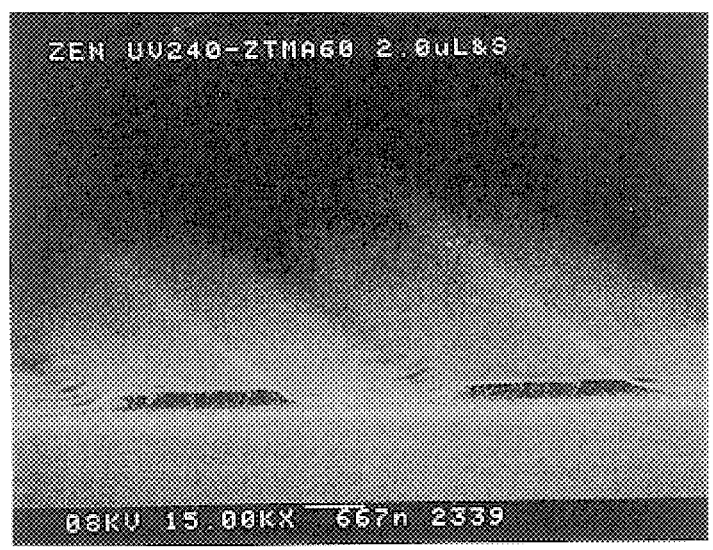
FIG. 6B is an enlarged perspective sectional picture showing the state of resist, which is employed for the film patterning steps according to the embodiment of the present invention, after ultraviolet rays have been irradiated onto the resist for 240 second after the development and then an alkali aqueous solution has been supplied to the surface of resist.
Figure 7A:
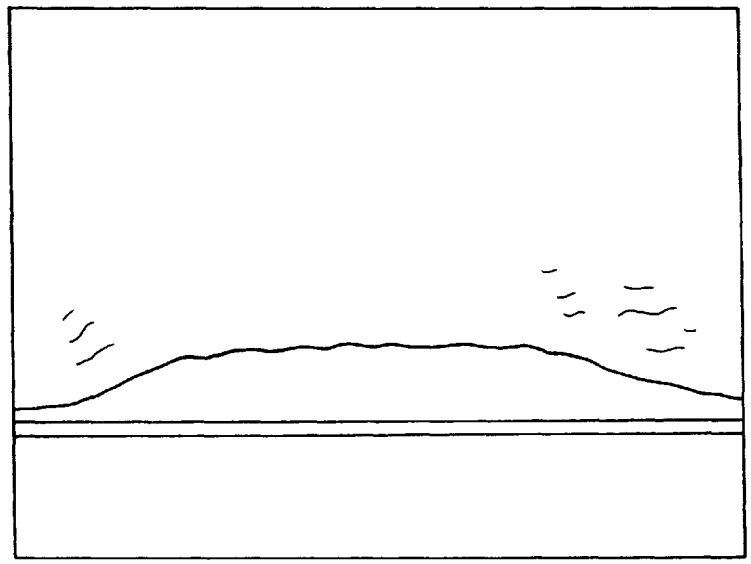
FIG. 7A is a perspective sectional view showing a part of the perspective sectional shape shown in FIG. 3 in a further enlarged manner.
Figure 8A:
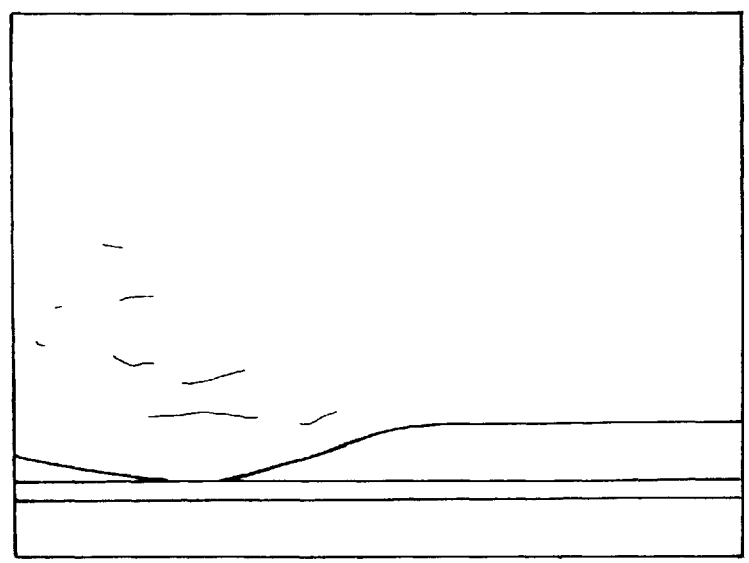
FIG. 8A is a perspective sectional view showing a part of the perspective sectional shape shown in FIG. 4 in a further enlarged manner.
Figure 7B:
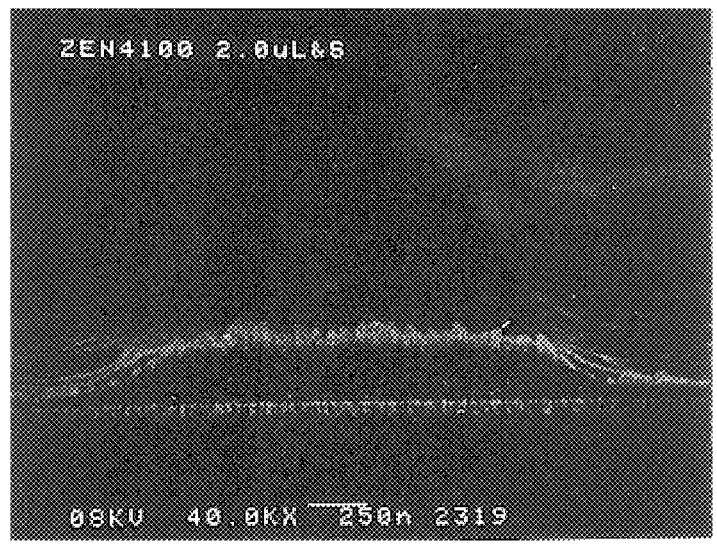
FIG. 7B is a perspective sectional picture showing a part of the perspective sectional shape shown in FIG. 3 in a further enlarged manner.
Figure 8B:
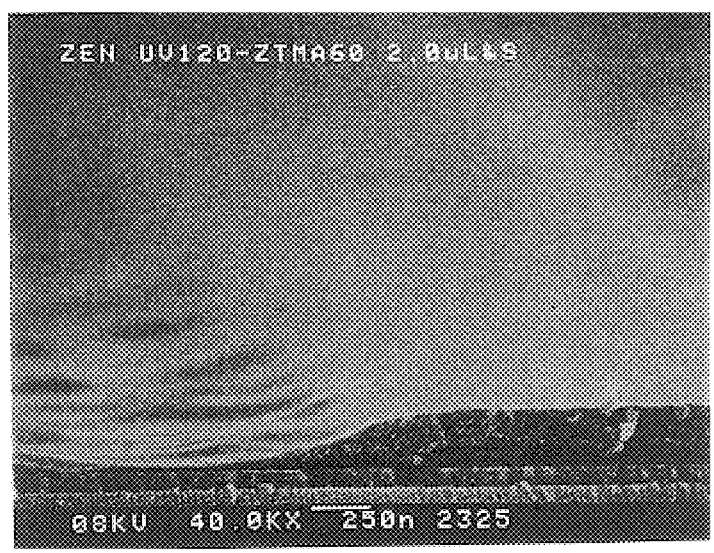
FIG. 8B is a perspective sectional picture showing a part of the perspective sectional shape shown in FIG. 4 in a further enlarged manner.
Figure 9A:
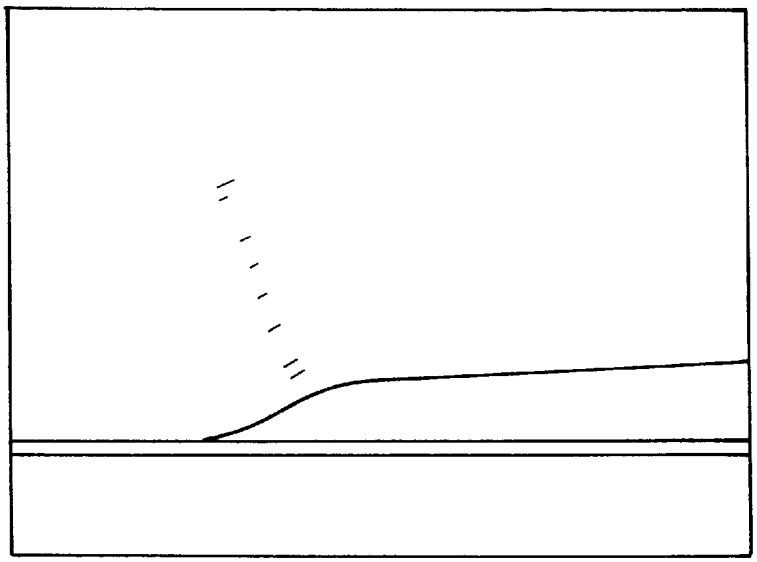
FIG. 9A is a perspective sectional view showing a part of the perspective sectional shape shown in FIG. 5 in a further enlarged manner.
Figure 10A:
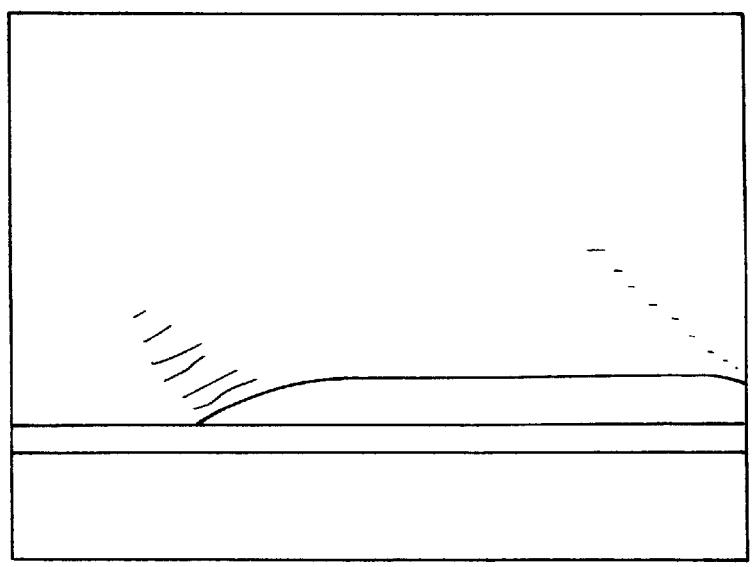
FIG. 10A is a perspective sectional view showing a part of the perspective sectional shape shown in FIG. 6 in a further enlarged manner.
Figure 9B:
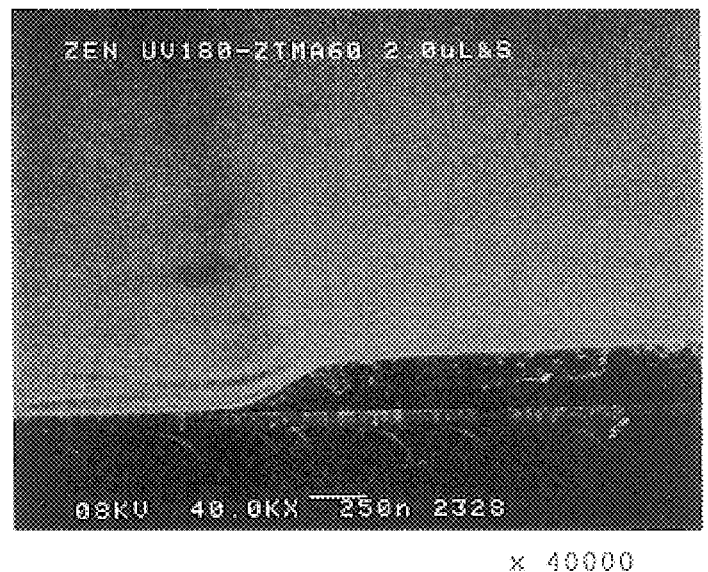
FIG. 9B is a perspective sectional picture showing a part of the perspective sectional shape shown in FIG. 5 in a further enlarged manner.
Figure 10B:
FIG. 10B is a perspective sectional picture showing a part of the perspective sectional shape shown in FIG. 6 in a further enlarged manner.

FIG. 6A shows the state of the substrate and layers formed on the substrate after ultraviolet rays have been irradiated onto the resist for 240 second after the development and then the alkali aqueous solution has been supplied to the resist.

According to FIGS. 3A, 4A, 5A and 6A, it has been understood that removal of the developed residues of the resist, which remain in the regions between the stripe-like resist patterns, is increased in compliance with the increase in the ultraviolet ray irradiation time and that, if the ultraviolet ray irradiation time is set to 180 second, the developed residues of the resist does not remain substantially in the regions between the resist patterns after the process by the alkali aqueous solution.

Then, line & space resist patterns being enlarged to 40000 times are shown in FIGS. 7A, 8A, 9A and 10A. FIGS. 7A, 8A, 9A, and 10A which correspond to FIGS. 3A, 4A, 5A, and 6A respectively are depicted based on respective SEM photographs as shown in FIGS. 7B, 8B, 9B and 10B.

From mutual comparison of FIGS. 7A, 8A, 9A and 10A, it is evident that, if the ultraviolet ray irradiation time becomes longer, an inclined angle of the taper portion on the side of the resist patterns which are subjected to the process performed by using the alkali aqueous solution is increased and also a bottom area of the taper portion is narrowed. In other words, it can be understood that a taper length is reduced or shortened after the process conducted by using the alkali aqueous solution, to thereby improve the precision of the resist patterns.

Meanwhile, it has been confirmed by the inventors of the present invention that the resist residue remaining before the state shown in FIGS. 4A, 5A and 6A, i.e., after the irradiation of the ultraviolet rays but before supply of the alkali aqueous solution, is reduced slightly smaller than the developed residues of the resist on the light shielding film 2 immediately after the development in FIG. 3A, nevertheless the resist residue still remain on the light shielding film 2.

In FIGS. 3A, 4A, 5A, 6A, 7A, 8A, 9A and 10A, zig-zag shapes formed on the side portion of the resist patterns are produced by shot deviation of the electron beam irradiation, and therefore they are not the developed residues of the resist.

Figure 11:
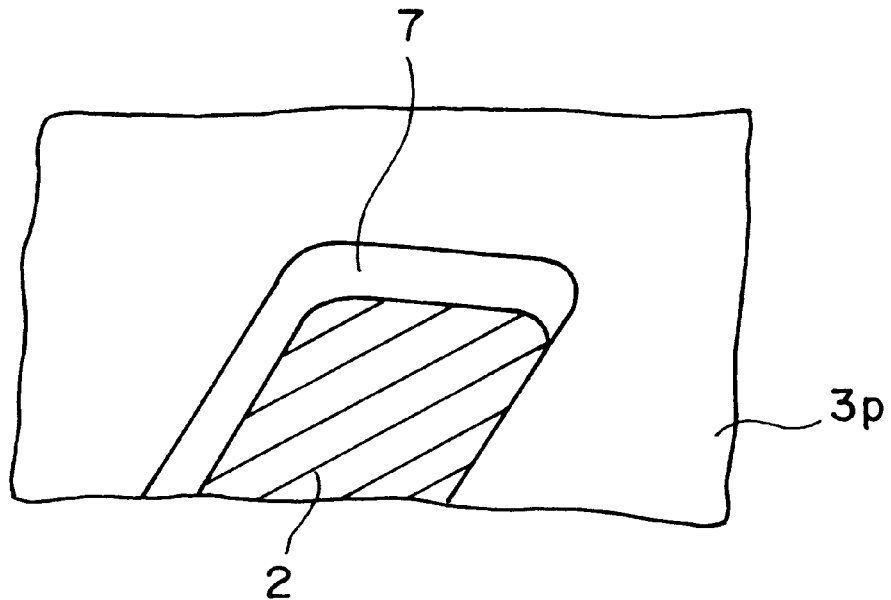
FIG. 11 is an enlarged perspective view showing the state of resist immediately after an opening has been formed by exposing and developing the resist, in the film patterning method according to the embodiment of the present invention.
Figure 12:
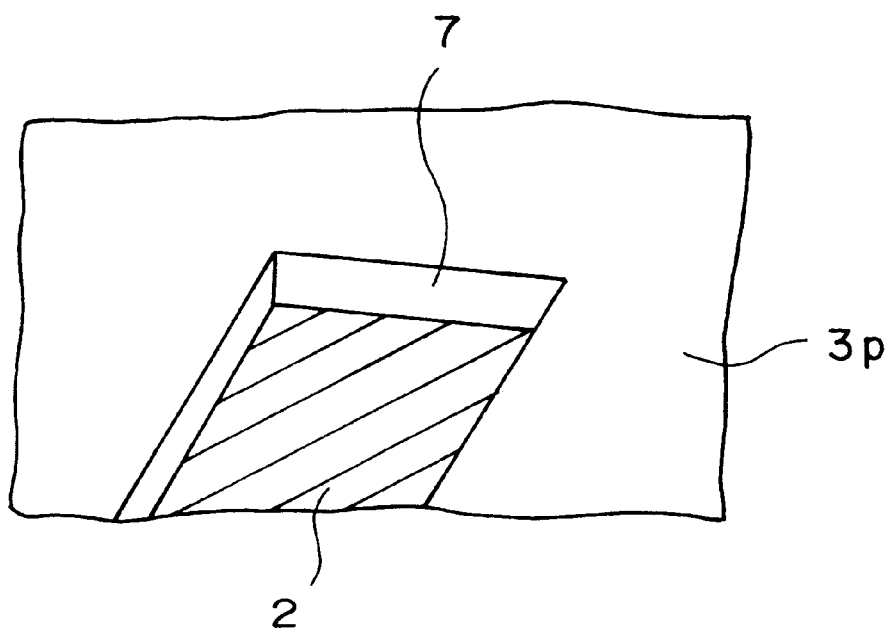
FIG. 12 is an enlarged perspective view showing the state of resist after the ultraviolet rays have been irradiated onto the resist after the state shown in FIG. 11 and then the alkali aqueous solution has been supplied to the surface of the resist.

If opening portions each of which has a square planar shape of 2 μm width are formed as the resist patterns 3p, circular arcs each of which has a radius of curvature of about 0.5 μm are formed at four corners of the opening 7, as shown in FIG. 11, immediately after the resist patterns 3p have been formed. When the irradiation of the ultraviolet rays and the process by the alkali aqueous solution are performed in this state, the radius of curvature of the four corners of the opening 7 can be reduced or sharpened to less than 0.2 μm, as shown in FIG. 12. As constituent material of the resist patterns 3 shown in FIGS. 11 and 12, "SAL-601" (product name) is employed. In this case, after "ZTMA-100" (product name) has been sprayed as the alkali aqueous solution, which is supplied to the "SAL-601" (product name), for 300 second by the spraying method, a resultant structure is rinsed for 60 second. Then, the rotating table is turned at a rate of 2000 rpm, so that the alkali aqueous solution is released from the structure to dry.

Then, a relationship between dimensional deviation of the resist patterns against dimensional design values of the reticle pattern and an irradiation amount of the ultraviolet rays is actually measured, and in addition a relationship between a dimensional tolerance showing dimensional distribution and the irradiation amount of the ultraviolet rays is actually measured.

The "dimensional deviation" means difference between actually measured average dimensional value of the resist patterns and a target dimensional value. The "dimensional tolerance" means difference between average of maximum values of the actually measured dimensional values of the resist patterns and average of minimum values thereof.

Figures 13A, 13B:
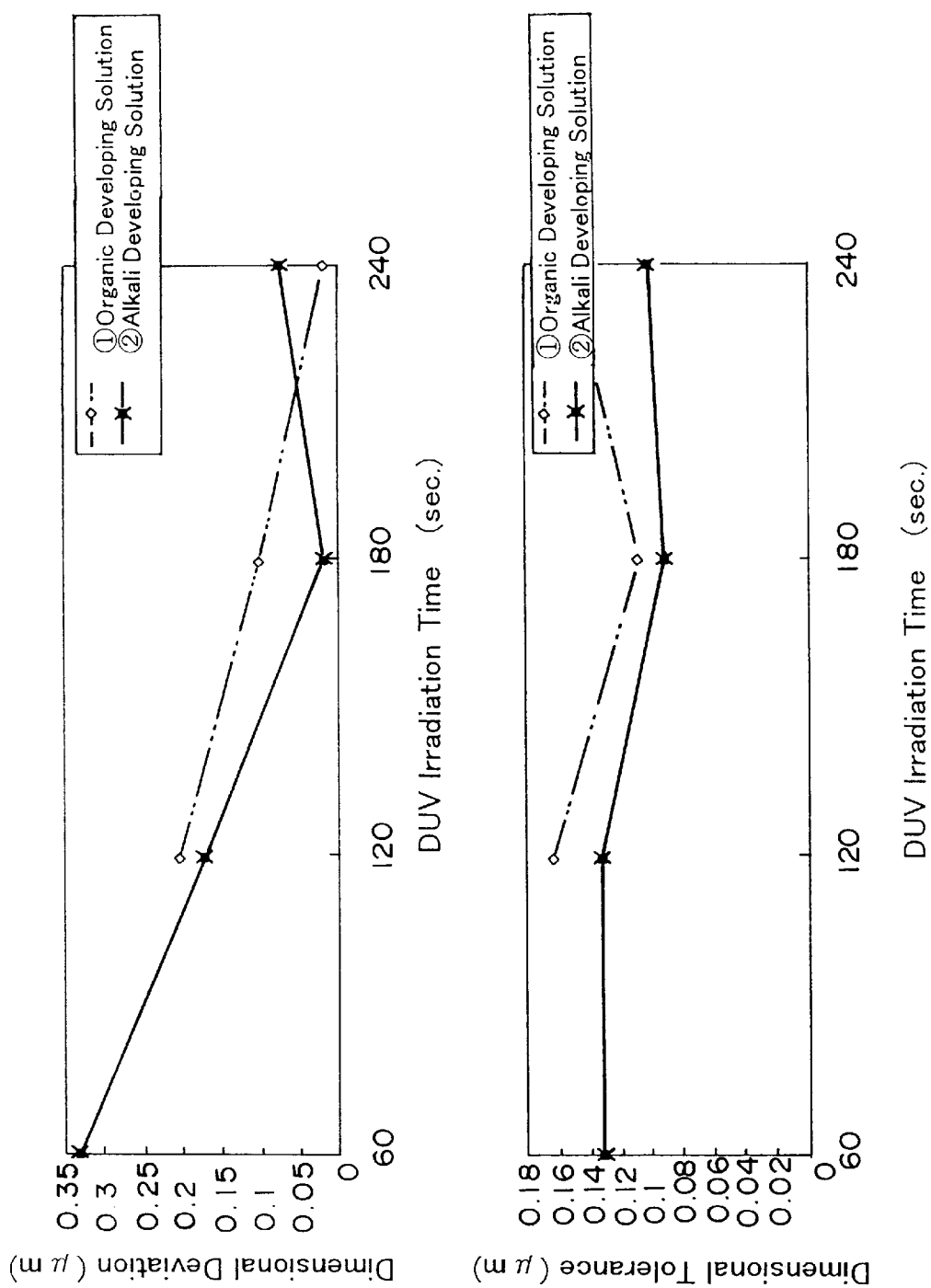
FIG. 13A is a graph showing a relationship between a ultraviolet ray irradiation time and dimensional deviation when the alkali aqueous solution or the organic liquid developing solution has been supplied to the surface of the resist after the ultraviolet ray irradiation.
FIG. 13B is a graph showing a relationship between the ultraviolet ray irradiation time and dimensional tolerance when the alkali aqueous solution or the organic liquid developing solution has been supplied to the surface of the resist after the ultraviolet ray irradiation.

As the result of actual measurement, both the relationship between a ultraviolet ray irradiation time and the dimensional deviation, as indicated by a solid line in FIG. 13A, and the relationship between the ultraviolet ray irradiation time and dimensional tolerance, as a solid line in FIG. 13B, have been derived.

In FIGS. 13A and 13B, a relationship between a ultraviolet ray irradiation time and a dimensional deviation and a relationship between the ultraviolet ray irradiation time and dimensional tolerance, both have been derived in the case that a hydrocarbon developing solution is employed in place of the alkali aqueous solution employed in the present embodiment, are also set forth together respectively.

According to the solid line in FIG. 13A, for the resist patterns which are subjected to the process conducted by using the alkali aqueous solution, the dimensional deviation has been reduced as the ultraviolet ray irradiation time is increased from 60 to 180 second. However, if the ultraviolet ray irradiation time is increased up to 240 second, the dimensional deviation has been increased. For this reason, it has been understood that increase in the ultraviolet ray irradiation time is not always desirable and thus a proper irradiation time for reducing the dimensional deviation is present. In the event that the hydrocarbon developing solution is employed in place of the alkali aqueous solution, the relationship between the ultraviolet ray irradiation time and the dimensional deviation has the same tendency as the case where the alkali aqueous solution is employed, as indicated by a chain double-dashed line in FIG. 13A, but the dimensional deviation is increased rather than the case where the alkali aqueous solution is employed. As a result, it has been found that a processing time of the organic liquid developing solution must be set longer to achieve the same dimensional deviation.

Also, as indicated by a solid line in FIG. 13B, it has been found that, as for the resist patterns which are subjected to the process of the alkali aqueous solution, the dimensional tolerance tends to be reduced as the ultraviolet ray irradiation time becomes longer. Further, as indicated by a chain double-dashed line in FIG. 13B, it has been found that, in the event that the organic liquid developing solution is employed in place of the alkali aqueous solution, the dimensional tolerance is increased rather than the case where the alkali aqueous solution is employed and therefore the organic liquid developing solution is inferior to the alkali aqueous solution even if the processing time is prolonged.

What the dimensional tolerance is reduced means that side lines of the resist patterns become close to a straight line. Therefore, if the dimensional deviation is considered together, the process of the alkali aqueous solution can improve the dimensional shape and the dimensional precision high rather than the case where the hydrocarbon developing solution is employed.

Accordingly, the inventors of the present invention come to such a conclusion that, with regard to improvement of the dimensional precision of the patterns, better results can be brought about if the alkali aqueous solution is employed rather than the organic liquid developing solution as the solution for removing the developed residues of the resist after the ultraviolet rays have been irradiated.

A mercury lamp is employed to irradiate the ultraviolet rays in the above explanation. But a light source which can irradiate the light having a shorter wavelength, e.g., a wavelength shorter than 172 nm may be employed.

Further, application of a series of above steps from the resist coating to the process of the alkali aqueous solution is not limited to the reticle formation. For example, it is of course that the above steps may be applied to the exposure mask and also they may be applied in steps of manufacturing a semiconductor device.

As described above, according to the present invention, the resist coated on the film is exposed and developed, then the ultraviolet rays irradiates onto the resist in the oxygen containing atmosphere, and then the alkali aqueous solution is supplied to the resist. Therefore, the resist residues which have been developed can be easily removed by the alkali aqueous solution after oxidation. Furthermore, since the developed residues of the resist are not removed only by oxidation but removed by the alkali aqueous solution thereafter, a time required for removing the developed residues of the resist can be shortened in contrast to the case where the developed residues of the resist are removed only by oxidation, and also a bad influence upon the shapes of the resist patterns can be prevented.

Moreover, thin areas of the taper portions formed on the side portions of the resist patterns can be removed together with the developed residues of the resist. Therefore, pattern precision of the resist can be improved.

What is claimed is:

1. A film patterning method comprising the steps of:

forming a film on a substrate;

coating resist on the film;

exposing the resist;

developing the resist by a liquid developing solution;

removing the liquid developing solution from a surface of the film;

irradiating ultraviolet rays onto the resist, which remains on the film after the developing step, in an oxygen containing atmosphere;

removing developed residue of the resist by supplying an alkali aqueous solution selected from the group consisting of a liquid containing tetramethylammonium hydroxide $(CH_3)_4NOH$, a liquid containing potassium hydroxide, and a liquid containing sodium hydroxide to the resist which has remained on the film; and forming patterns of the film by etching the film exposed from the resist.

2. A film patterning method according to claim 1, wherein the substrate is formed of quartz glass, and the film is formed of chromium or chromium oxide.

3. A film patterning method according to claim 1, wherein the oxygen containing atmosphere is the ambient atmosphere.

4. A film patterning method according to claim 1, wherein the resist contains a radical trap agent.

5. A film patterning method according to claim 1, wherein the resist is copolymer of chloromethyl styrene and chlorostyrene.

6. A film patterning method according to claim 1, wherein the resist is electron beam resist, and the exposing step is made by irradiating electron beams onto the resist.

* * * * *